United States Patent [19]
Bauer

[11] Patent Number: 5,889,413
[45] Date of Patent: *Mar. 30, 1999

[54] LOOKUP TABLES WHICH DOUBLE AS SHIFT REGISTERS

[75] Inventor: Trevor J. Bauer, Campbell, Calif.

[73] Assignee: Xilinx, Inc., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 754,421

[22] Filed: Nov. 22, 1996

[51] Int. Cl.$^6$ ................................................. H03K 19/177
[52] U.S. Cl. ................................................. 326/40; 326/41
[58] Field of Search ........................................... 326/37–40

[56] References Cited

U.S. PATENT DOCUMENTS

| | | | |
|---|---|---|---|
| Re. 34,363 | 8/1993 | Freeman | 307/465 |
| 4,821,233 | 4/1989 | Hsieh | 365/203 |
| 4,870,302 | 9/1989 | Freeman | 362/39 |
| 5,321,399 | 6/1994 | Notani et al. | 341/100 |
| 5,343,406 | 8/1994 | Freeman et al. | 364/490 |
| 5,352,940 | 10/1994 | Watson | 326/39 |
| 5,394,031 | 2/1995 | Britton et al. | 326/27 |
| 5,414,377 | 5/1995 | Freidin | 326/41 |
| 5,422,823 | 6/1995 | Agrawal et al. | 326/41 |
| 5,442,306 | 8/1995 | Woo | 326/39 |
| 5,694,056 | 12/1997 | Mahoney et al. | 326/38 |

OTHER PUBLICATIONS

Xilinx, Inc., "The Programmable Logic Data Book," 1996, 4–1 through 4–372, available from Xilinx, Inc., 2100 Logic Drive, San Jose, California 95124.

*Primary Examiner*—Michael Tokar
*Assistant Examiner*—Don Phu Le
*Attorney, Agent, or Firm*—Edel M. Young; Michael R. Casey; Lois D. Cartier

[57] ABSTRACT

A logic element for an FPGA which can be configured as any one of a random access memory, a shift register and a lookup table. The logic element includes a plurality of memory cells which are interconnected such that the data output of each cell can serve as the input to the next memory cell. Thus the logic element effectively functions as a shift register. Shift registers of arbitrary length can be created by using a lookup table address multiplexer to select any memory cell output (not necessarily the last memory cell output) of the lookup table, and by chaining lookup tables of plural logic elements in series.

13 Claims, 7 Drawing Sheets

4-input Lookup Table / 16-Bit Shift Register

FIG. 1 Prior Art

Memory Cell for Lookup Table

FIG. 3 Prior Art

2-input Lookup Table

FIG. 2 Prior Art 4-input Lookup Table

FIG. 4
Prior Art
Memory Cell for Lookup and RAM

FIG. 6
Prior Art
2-input Lookup/ 4-Bit RAM

FIG. 5  Prior Art  4-input Lookup Table / 16-Bit RAM

FIG. 9
2-input Lookup / 4-Bit Shift

FIG. 7 Memory Cell for Lookup and Shift

FIG. 8 4-input Lookup Table / 16-Bit Shift Register

FIG. 12 2-input Lookup / 4-Bit Shift / 4-Bit RAM

FIG. 10 Memory Cell for Lookup/Shift Bit/RAM Bit

FIG. 11 4-input Lookup Table / 16-Bit Shift Register / 16-Bit RAM

LOOKUP TABLES WHICH DOUBLE AS SHIFT REGISTERS

FIELD OF THE INVENTION

This invention relates to means and methods of customizing reprogrammable logic functions in an integrated circuit logic device.

BACKGROUND OF THE INVENTION

Xilinx, Inc. the assignee of the present application, manufactures FPGAs, the complexity of which continues to increase. Freeman in U.S. Reissue 34,363, incorporated herein by reference, which is a re-issue of original U.S. Pat. No. 4,870,302, describes the first FPGA. An FPGA is an integrated circuit chip which includes a plurality of programmable input/output pads, a plurality of configurable logic elements, and a programmable interconnect for interconnecting the plurality of logic elements and pads. Each logic element implements a logic function of the n inputs to the logic element according to how the logic element has been configured. Logic functions may use all n inputs to the logic element or may use only a subset thereof. A few of the possible logic functions that a logic element can be configured to implement are: AND, OR, XOR, NAND, NOR, XNOR and mixed combinations of these functions.

One disclosed implementation of the logic element includes a configurable lookup table which is internal to the logic element and which includes $2^n$ individual memory cells. At configuration, in this architecture a bitstream programs the individual memory cells of the lookup table with a desired function by writing the truth table of the desired function to the individual memory cells. Although the programming is described as being performed serially, other techniques for parallel programming are also known.

Figure 1:
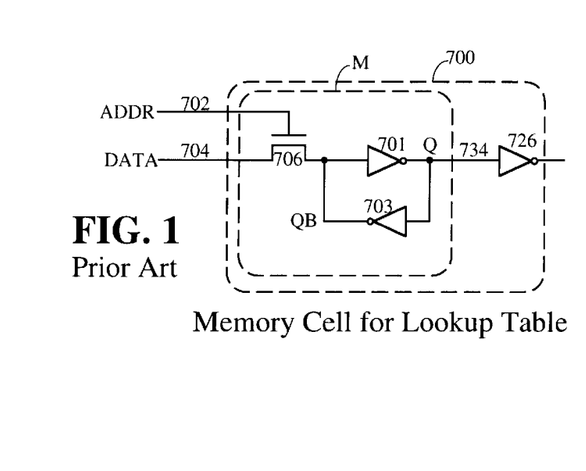
FIG. 1 is a schematic illustration of a first prior art memory cell architecture used in lookup tables in FPGAs where a value of the memory cell is stored during configuration.

One memory cell architecture appropriate for use in the lookup tables is shown in FIG. 1 and described by Hsieh in U.S. Pat. No. 4,821,233, incorporated herein by reference. A memory cell of this architecture is programmed by applying the value to be written to the memory cell on the data input line, "Data," and strobing the corresponding address line, "ADDR." Further, although this architecture uses five transistors, other known configurations, e.g., six transistor static memory cells, also are appropriate choices for implementing the memory cells of the lookup table. As shown in FIG. 1, inverter 726 may be included to increase the drive of memory cell 700.

After configuration, to use a lookup table, the input lines of the configured logic element act as address lines which select a corresponding memory cell in the lookup table. For example, a logic element configured to implement a two-input NAND gate would output the corresponding value {1, 1, 1, or 0} contained in the one of the four memory cells corresponding to the current input pair {00, 01, 10, 11}, respectively.

Figure 2:
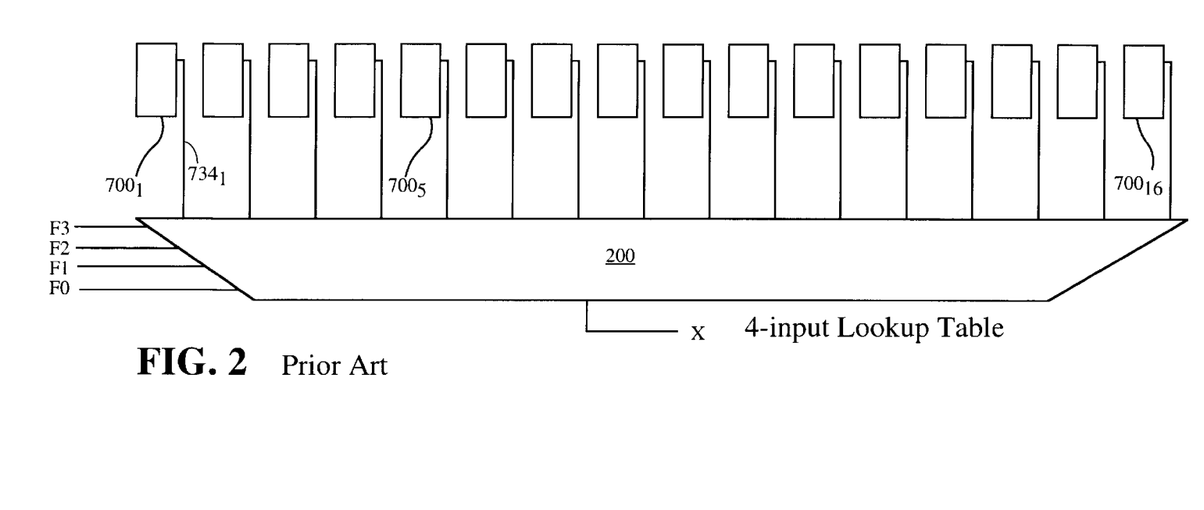
FIG. 2 is a block diagram of a prior art programmable 4-input look-up table implemented by a sixteen-to-one decoding multiplexer and a series of sixteen memory cells.

This selection is performed by a decoding multiplexer which selects a memory cell from the lookup table on the basis of the logic levels of the input lines. A block diagram of an exemplary four-input lookup table composed of 16 memory cells $700_1$ through $700_{16}$ and a decoding multiplexer 200 is shown in FIG. 2. The multiplexer propagates a value stored in one of the memory cells $700_1$–$700_{16}$ of the lookup table to an output X of the lookup table as selected by the four input signals F0–F3.

Figure 3:
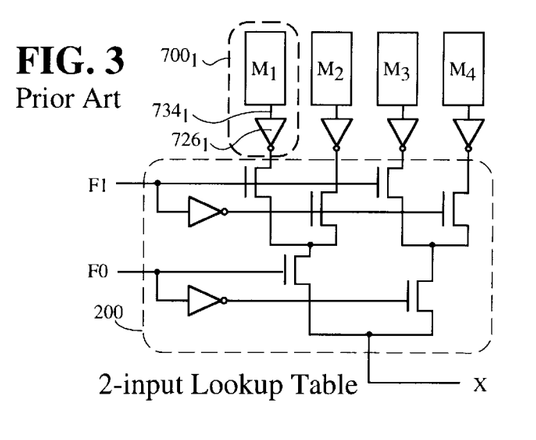
FIG. 3 is an expanded view of a schematic illustration of a prior art two-input lookup table and a decoding multiplexer implemented by a hierarchy of pass gates.

FIG. 3 is a schematic diagram of another embodiment of a lookup table. In this embodiment, the lookup table is implemented using four memory cells $700_1$–$700_4$ and a two-input decoding multiplexer 200 with two input signals, F0 and F1. The two-input decoding multiplexer 200 is shown in detail as being implemented by a hierarchy of pass transistors which propagate the value stored in the selected memory cell to the output X of the logic element. In FIG. 3, the memory cells may be implemented as shown in FIG. 1.

Figure 4:
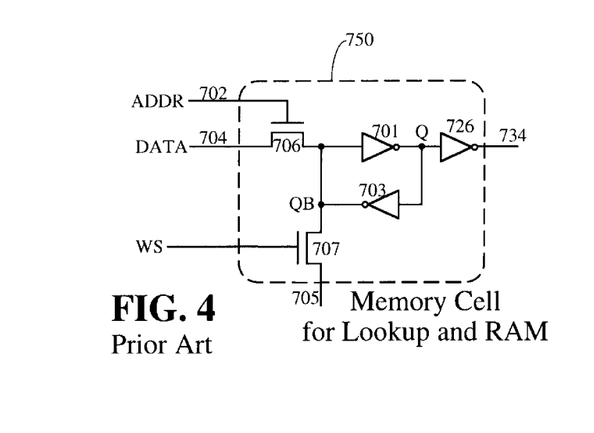
FIG. 4 is a schematic illustration of a second prior art memory cell architecture used in lookup tables where the value of the memory cell is stored at configuration and remains dynamically readable and writable after configuration.

The above architecture was later augmented to enhance the functionality of the lookup tables. U.S. Pat. No. 5,343,406 to Freeman et al incorporated herein by reference, describes how additional circuitry can enable lookup tables to behave as random access memories (RAMs) which can be both read and written after configuration of the logic device. When the option of allowing the user to write data to memory cells is available, there also must be provision for entering the user's data into these memory cells and reading from the memory cells. This capability is provided by including two means for accessing each dual function memory cell, one which is used to supply the configuration bitstream from off the chip, and another which is used during operation to store signals that are routed from the interconnect lines of the FPGA. FIG. 4 shows the memory cell architecture described in U.S. Pat. No. 5,343,406 which allows memory cell 750 to be programmed both during and after configuration. During configuration, memory cell 750 is programmed using the same process for programming the memory cell of FIG. 1.

After configuration, memory cell 750 is programmed differently. A value to be written to memory cell 750 is applied through the interconnect structure of the FPGA to the second data line 705, and then the corresponding write-strobe line WS for the memory cell is pulsed. This pulse latches the value on line 705 into memory cell 750. Like the lookup table of FIG. 2 which uses a series of memory cells from FIG. 1, a series of memory cells from FIG. 4 are combinable into a lookup table.

Figure 5:
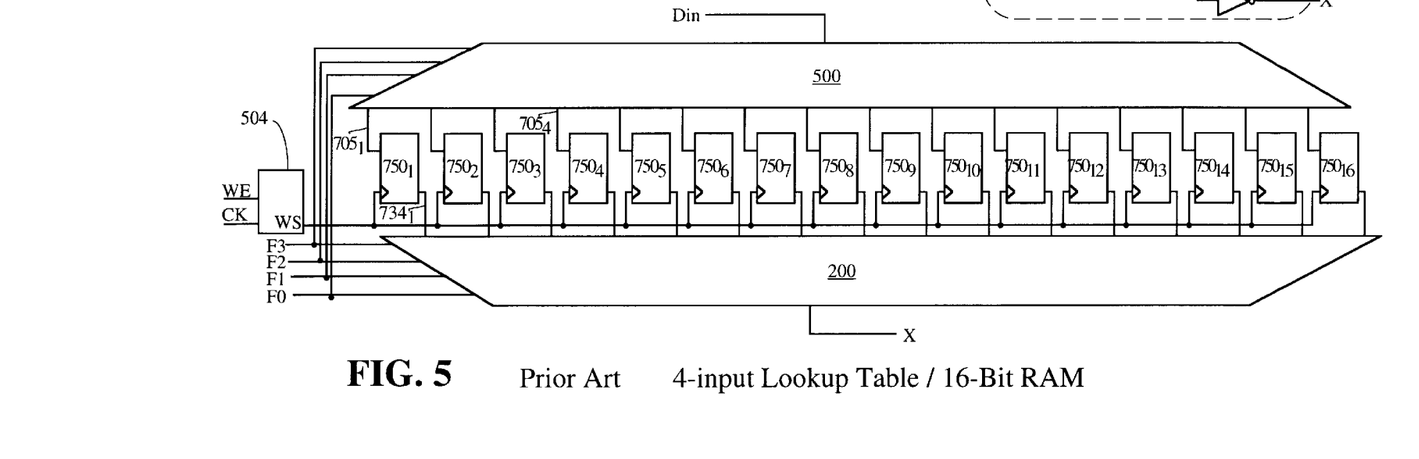
FIG. 5 is a block diagram of a prior art logic element that is configurable to implement either a sixteen-by-one random access memory or a four-input lookup table.

FIG. 5 is a block diagram showing a four-input lookup table with synchronous write capability. There is a write strobe generator 504 which receives a clock signal, CK, and a write enable signal, WE, and creates a single write strobe signal, WS, for the lookup table. To write a value to a desired memory cell, say $750_5$, the value is applied on line $D_{in}$ and the address of the desired memory cell $750_5$ is applied to the input lines F0–F3 of demultiplexer 500. The value then is latched into the desired memory cell $750_5$ by pulsing the write strobe. Conversely, to read a value stored in a different desired memory cell $750_3$, the address of the memory cell $750_3$ is applied to the input lines F0–F3 of decoding multiplexer 200 (without pulsing the write strobe), as was described with reference to FIGS. 2 and 3.

Figure 6:
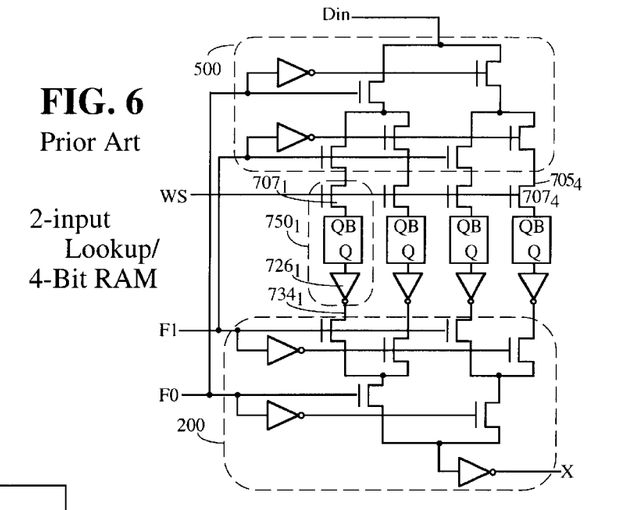
FIG. 6 is a schematic illustration of a prior art logic element that is configurable to implement either a four-bit random access memory or a two-input lookup table.

FIG. 6 is a schematic illustration of a two-input lookup table with synchronous write capability. FIG. 6 includes four memory cells $750_1$, through $750_4$. Detail of demultiplexer 500 and multiplexer 200 is shown in FIG. 6.

The implementation and operation of other logic array devices are described in "The Programmable Logic Data Book," pages 4-1 to 4-372, copyright 1996 by Xilinx, available from Xilinx, Inc., 2100 Logic Drive, San Jose, Calif. 95124. This portion of the contents of "The Programmable Logic Data Book" is incorporated herein by reference.

SUMMARY OF THE INVENTION

The present invention provides means and method for programming a configurable logic element so that the logic element can implement any one of a shift register and a combinatorial logic function using a lookup table. In one embodiment, the invention further provides for implementing a random access memory in this same logic element. The lookup table includes a plurality of memory cells which are connected in series so that an output of a first memory cell is configurable as an input to a second memory cell of the same lookup table. Further, by connecting shift registers of plural logic elements in series, larger shift registers can be built from smaller shift registers. Previous architectures built n-bit shift registers out of n flip flops connected in series, thereby wasting interconnect resources and logic while achieving mediocre performance.

In one mode, the memory cells which store the lookup table values are used as registers in a shift chain. When the logic element is in shift register mode, the Data-in value is shifted into the first cell and the value in each memory cell is shifted to the next cell. When the logic element is in random access memory mode, the Data-in value is written to a cell addressed by F3–F0, as discussed above. When the logic element is in pure lookup table mode, no value can be written after configuration and the logic element continues to generate the function loaded in during configuration.

BRIEF DESCRIPTION OF THE DRAWINGS

FIG. 13 comprising FIGS. 13A through 13H shows waveform diagrams of the operation of the logic element when configured in shift-register mode.

DETAILED DESCRIPTION

Figure 7:
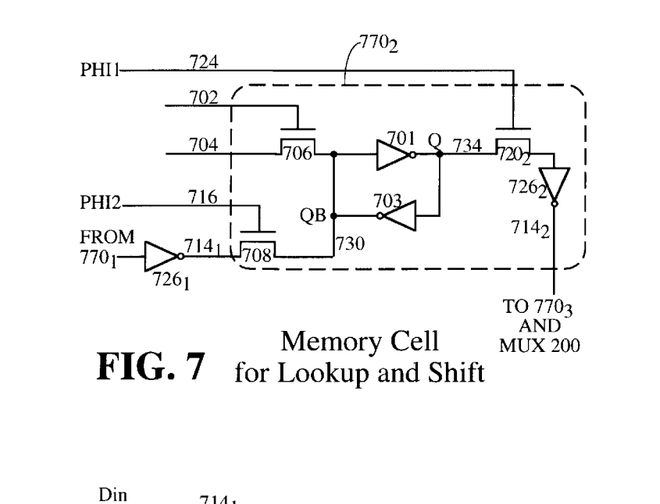
FIG. 7 is a schematic illustration of a memory cell architecture according to the present invention which can alternatively be configured as a shift register or a lookup table.

With an increase in logic gate density, a shift register can now be implemented as one element of a larger user-configurable integrated circuit logic array. In a first embodiment of the present invention, a logic element is configurable to implement both an n-bit shift register and a ($\log_2 n$)-input lookup table. FIG. 7 shows a schematic illustration of a memory cell $770_2$ of the logic element architecture according to the present invention which, when configured to be in shift register mode, advantageously enables a value to be shifted from a preceding memory cell $770_1$ into the memory cell $770_2$. Memory cell $770_2$ includes a pass transistor 706. The configuration value is written into memory cell $770_2$ by pulsing configuration control line 702 of transistor 706, while applying the configuration value to the data line 704.

Figure 7A:
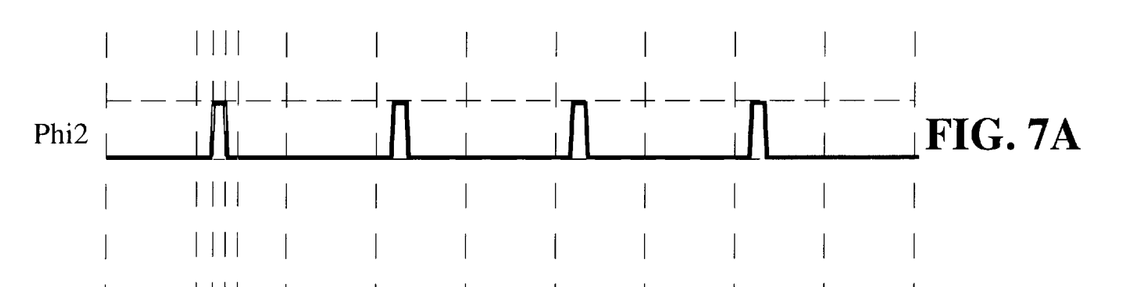
FIGS. 7A and 7B are waveform diagrams showing non-overlapping signals Phi1 and Phi2 which cause a bit value to shift from a preceding memory cell into the current memory cell when Phi2 is asserted.
Figure 7B:
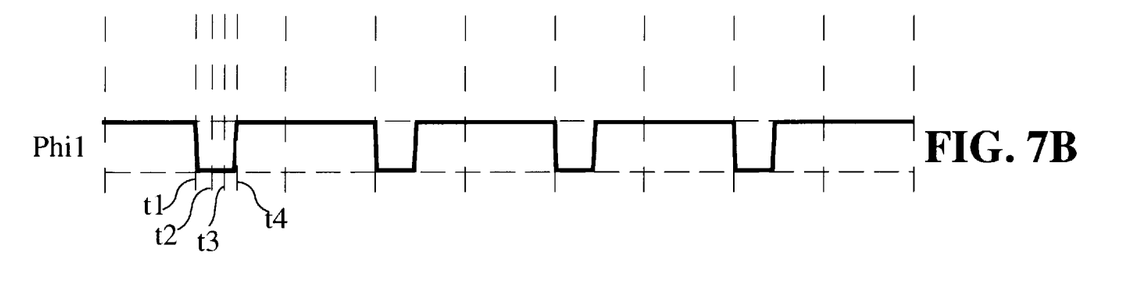

The output of memory cell $770_2$ is programmably connected to the input of a next memory cell $770_3$ by pass transistors $720_2$, inverter $726_2$, and a next pass transistor $708_3$ not shown in FIG. 7. As shown by the timing diagrams in FIGS. 7A and 7B, during most of each cycle the clocking signal Phi1 on output control line 724 remains high, and thus the output signal $734_2$ of memory cell $770_2$ is applied through inverter $726_2$ to shift input line $714_2$ leading to the next memory cell $770_3$. When Phi1 goes low at time t1, pass transistor $720_2$ is turned off. Inverter $726_2$ continues for a short time to hold as an output signal the logic level previously asserted by memory cell $770_2$. In this way, the combination of transistor $720_2$ and inverter $726_2$ serves as a temporary latch. When a second clocking signal, Phi2, is asserted at time t2 on input control line 716, inverter 701 receives both the output of inverter 703 of memory cell $770_2$ and the output of inverter $726_1$ of the previous memory cell $770_1$. Each inverter 726 is designed to overpower the inverter 703 so that values can be shifted between adjacent memory cells. Therefore, the current value stored in memory cell $770_2$ is overwritten by the output of the previous memory cell $770_1$. When Phi2 returns low at time t3, memory cell $770_2$ is once again latched, holding its current value independent of changes in shift input line $714_1$. At time t4, Phi1 goes high, thus applying the new value to inverter $726_2$. Thus in one clock cycle, a bit shifts one cell. In contrast, if Phi1 and Phi2 mistakenly overlapped, the value of the output 734 of each memory cell 770 would propagate from preceding memory cell $700_1$ through memory cell $770_2$ to the next memory cell $770_3$. This would not produce the desired single bit shift. However, by using non-overlapping two-phase clocking, as shown in FIGS. 7A and 7B, the memory cells shift one bit per cycle of Phi1 and Phi2.

Figure 8:
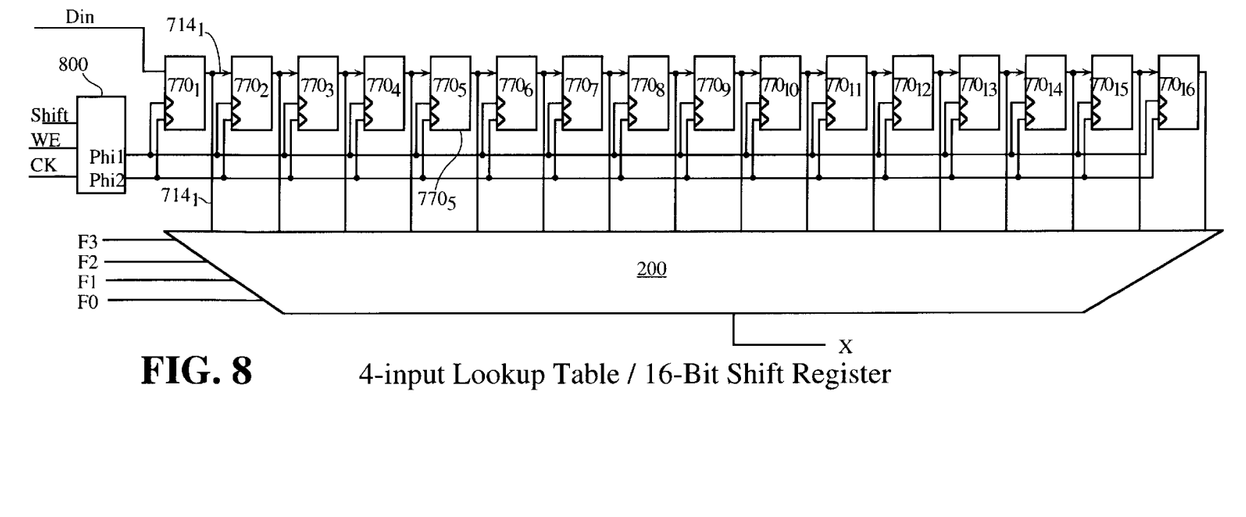
FIG. 8 is a block diagram of a logic element according to the invention that can implement either a four-input lookup table or a 16-bit shift register.

FIG. 8 shows a logic element which implements a 16-bit shift register and 4-input lookup table according to a first embodiment of the invention. For simplicity, in FIG. 8 the structures within memory cells 770 of FIG. 7 have not been explicitly illustrated.

In FIG. 8, when in shift register mode, a first memory cell $770_1$ of the memory is programmed with an initial value. The memory cell's value may be over written with a new value by applying the new value to the $D_{in}$ terminal of the first memory cell $770_1$ and strobing the clock line, CK. The strobing of CK in turn invokes the two-phase clocking cycle of FIGS. 7A and 7B. As data is moved synchronously from left to right in the shift register, i.e., from the first memory cell $700_1$ to a last memory cell $700_{16}$, the logic element can continue to act as a lookup table though the function changes with every clock cycle. As in the prior art lookup tables, the decoding multiplexer 200 outputs on output line X the contents of the memory cell selected by the user inputs, i.e., F0–F3.

Figure 9:
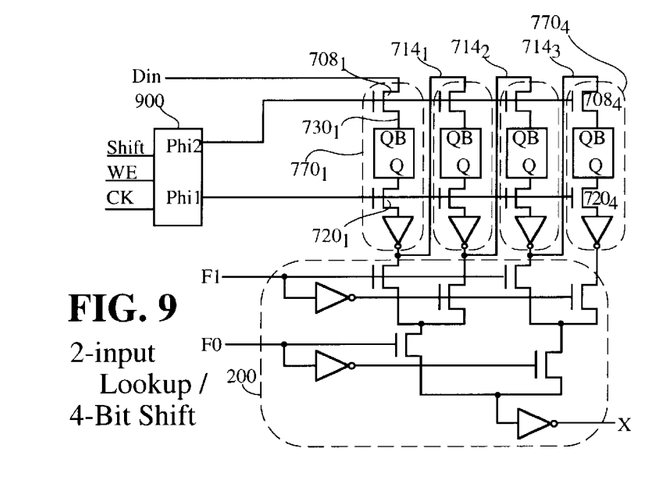
FIG. 9 is a circuit diagram of a logic element according to the invention that can implement either a 2-input lookup table or a 4-bit shift register, where the mode of the logic element controls the operation of the control logic, and may be stored in configuration memory.

FIG. 9 shows a structure for implementing a 2-input lookup table or a 4-bit shift register, and shows internal structure of multiplexer 200 and memory cells $770_1$ through $770_4$. FIG. 9 is oriented on the page the same way as FIG. 8, and thus assists in understanding the relationship between the elements that make up the lookup table/shift register embodiment.

Figures 10, 11, 12:
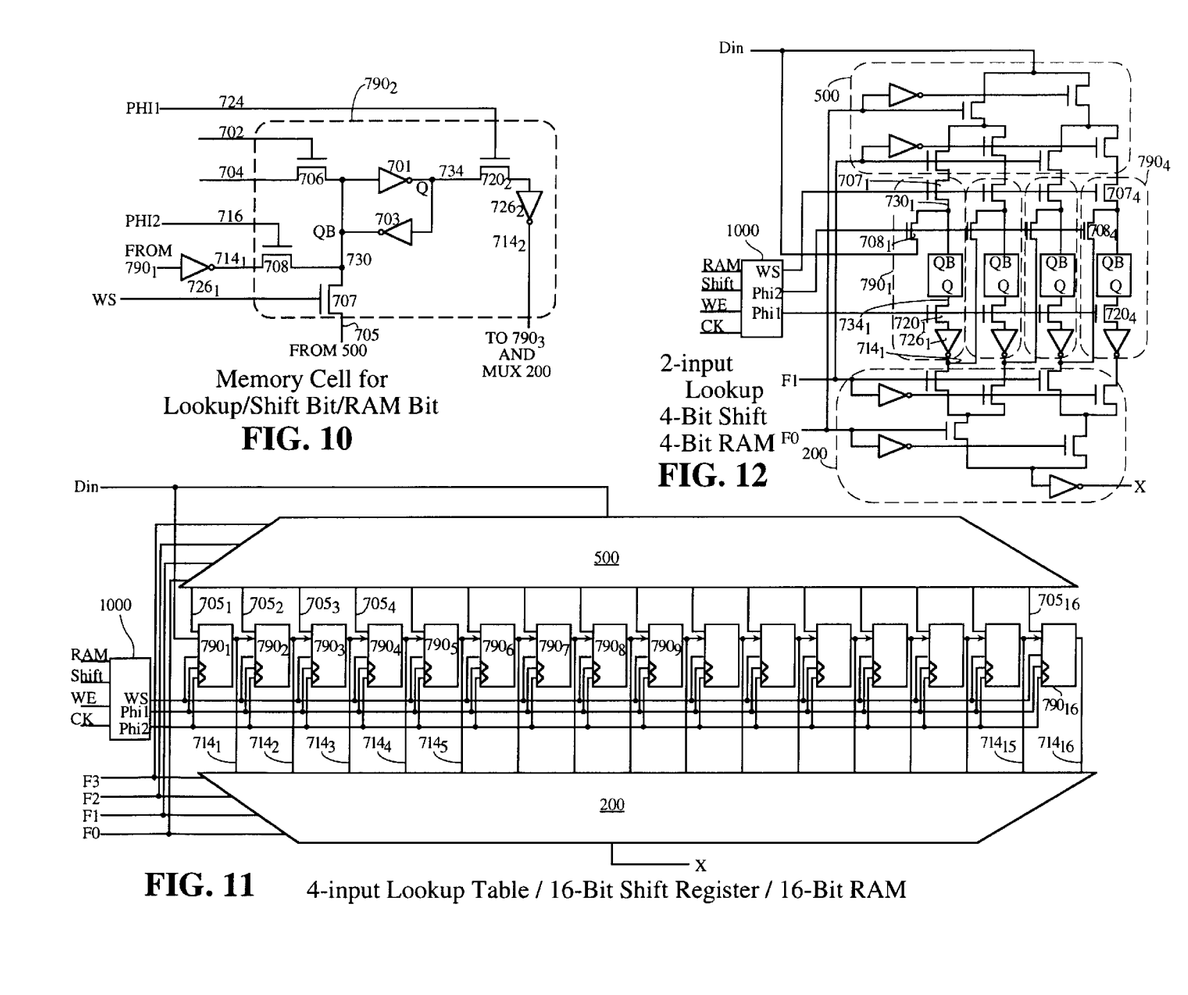
FIG. 10 is a schematic illustration of a memory cell for implementing any of a lookup table, a shift register, or a RAM.
FIG. 11 is a block diagram of a logic element that is configurable to implement any one of a four-input lookup table, a sixteen-bit shift register, and a sixteen-bit random access memory.
FIG. 12 is a schematic diagram of a logic element according to the present invention that is configurable to implement any one of a two-input lookup table, a four-bit shift register, and a four-bit random access memory.

In a second embodiment of the present invention, a logic element is configurable to implement an n-bit shift register, an n-bit random access memory, and a ($\log_2$ n)-input lookup table. FIGS. 10–12 illustrate this embodiment. FIG. 10 illustrates the memory cell. The memory cell of FIG. 10 can be loaded from three different sources. During configuration, memory cell $790_2$ is loaded by applying configuration data to line 704 and strobing control line 702 of transistor 706. When memory cell $790_2$ is in shift register mode, it is loaded through transistor 708, as discussed above. When memory cell $790_2$ is in RAM mode, it is loaded through demultiplexer 500 on line $705_2$. Write strobe line WS is pulsed, turning on transistor 707, and thus applying a data signal to node 730.

FIG. 11 shows a logic element which implements any one of a 16-bit shift register, a 16-bit random access memory, and 4-input lookup table according to the second embodiment of the present invention. In this embodiment, a memory cell, say $790_5$, of the lookup table is programmed with an initial value during configuration as discussed above,. Subsequently, the initial value may be replaced in either of two ways, depending on the mode of the logic element: shift or RAM.

When the lookup table including memory cells 790 is being used in RAM mode, each memory cell 790 receives its data input on RAM input line 705. To write to any memory cell 790, the write strobe line WS pulses, thereby driving the value of $D_{in}$ through demultiplexer 500 into the addressed memory cell via input line 730.

The operation of the logic element in each of these modes is controlled by control logic 1000. Control bits which specify whether the logic element is in RAM mode, shift mode, or neither are inputs to control logic unit 1000. Control logic unit 1000 also receives the user clock signal and the write enable signal. From these inputs, control logic unit 1000 outputs Phi1, Phi2 and write strobe signal WS to either shift data between memory cells, to write to a particular memory cell, or to leave the memory cell data untouched. When in shift register mode, as in FIG. 8, data is moved synchronously from left to right in the shift register, i.e., from the first memory cell $790_1$ to a last memory cell $790_{16}$, as described above, by invoking a two-phase clocking cycle when CK is strobed. On the other hand, when the logic element is configured as a random access memory (RAM), the addressing lines F0–F3 select one of the memory cells ($790_1$ through $790_{16}$) to be written to and read from by using the demultiplexer 500 and the decoding multiplexer 200, respectively. When in shift register mode, the first memory cell $790_1$ receives as its input the signal applied to line $D_{in}$. When in RAM mode, memory cell $790_1$ receives an input signal on line $705_1$ from demultiplexer 500.

In RAM mode, to write to a given memory cell, say $700_5$, the write enable line WE must be active. When the user clock signal CK is asserted in conjunction with the active WE signal, control logic unit 1000 generates a write strobe WS. When the write strobe WS is high, memory cell $700_5$ addressed by address lines F0–F3 of the demultiplexer 500 receives the value from data input line $D_{in}$, This value overwrites the previous contents of the memory cell $700_5$. No other memory cells receive the value applied to $D_{in}$ since they are not addressed and therefore separated from $D_{in}$ by high impedance connections from the demultiplexer 500.

FIG. 12 is a schematic illustration which shows more detail of a logic element according to the second embodiment of the present invention. Collectively, demultiplexer 500, decoding multiplexer 200, pass transistors 708 and 720, inverters 726, and RAM mode pass transistors 707 form an interconnection network and are combined with memory cells ($790_1$ through $790_4$) and control logic unit 1000 to implement the logic element according to the second embodiment. If the logic element of the second embodiment is not configured as a shift register, then the logic element acts as either a random access memory or a lookup table. In either non-shift register mode, Phi2 is maintained at a low level, deactivating pass transistors 708, thereby blocking data from one memory cell $790_i$ from affecting the next memory cell $790_{i+1}$. Also, in the non-shift register modes, Phi1 is maintained at a high logic level, thereby feeding the outputs of the memory cells ($790_1$ to $790_4$) through to the decoding multiplexer 200. As before, the output of the logic element is selected by the decoding multiplexer 200 according to the user inputs F0 and F1.

When the logic element of FIG. 12 is configured as a shift register, the RAM mode pass transistors 707 are turned off because WS is held low, isolating the memory cells from the outputs of demultiplexer 500. Memory cell $790_1$ is programmably connected to $D_{in}$ through transistor $708_1$. To shift values, control logic unit 1000 produces control signals Phi1 and Phi2, triggered while the write enable signal is active by a rising edge of the User Clock signal CK applied to control logic unit 1000 such that values are shifted from one memory cell to next memory cell, i.e., from memory cell $790_{i-1}$ to memory cell $790_i$, and from memory cell $790_i$ to memory cell $790_{i+1}$. When control logic unit 1000 receives a rising edge of the user clock signal, control logic unit 1000 first pulls Phi1 low, then pulses Phi2 high long enough to overwrite the contents of the memory cells ($790_1$ to $790_4$), and lastly reasserts Phi1 after Phi2 has fallen. It is important for extremely low clocking frequencies that Phi2 be only a pulse since Phi1 must be off while Phi2 is on. To accomplish this, the control logic is designed so that Phi1 and Phi2 do not rely on the falling edge of the User Clock signal 1008, but rather are self-timed.

Figure 13:
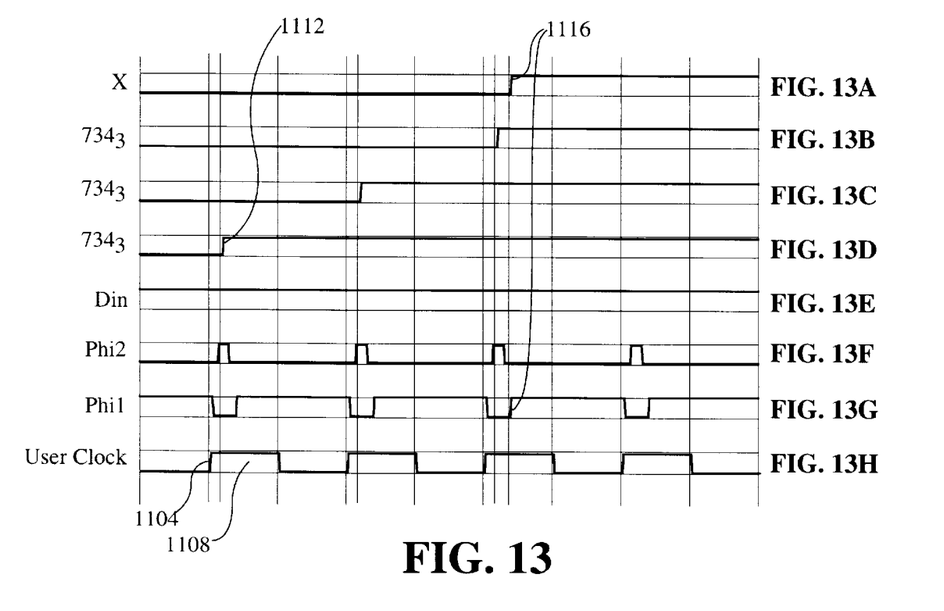

FIG. 13 comprising FIGS. 13A through 13H are waveform diagrams of the operation of the logic element of FIG. 12,. When the logic element of FIG. 12 is configured in shift-register mode, setting F1 to 1 and F0 to 0 makes it function as a three-bit shift register. As shown in FIG. 13E, the input, $D_{in}$, to the three-bit shift register is maintained continuously at a high logic level throughout the example. Upon receiving a rising edge 1104 of a first user clock pulse 1108, control logic unit 1000 pulls Phi1 to a low logic level, as shown in FIG. 13G, to deactivate pass transistors 720 (FIG. 12). After temporarily having isolated the outputs $734_1$ through $734_4$ of the memory cells ($790_1$ through $790_4$) from inputs of inverters $726_1$ through $726_4$, the control logic unit 1000 asserts Phi2, which propagates outputs of inverters $726_1$ through $726_4$ to their corresponding next memory cells, i.e., memory cells $790_2$ through $790_4$. When Phi2 is asserted, the value on $D_{in}$ is written to first memory cell $790_1$. The non-overlapping Phi2 pulse is shown in FIG. 13F. As shown in FIG. 13D, the value stored in first memory cell $790_1$ (corresponding to $734_1$) changes shortly after Phi2 is asserted. This change is indicated by reference 1112. The new value of output $734_1$ of the first memory cell $790_1$ does not affect the second memory cell $790_2$ (corresponding to $734_2$) because Phi1 is temporarily inactive. After asserting Phi2 long enough for the memory cells ($790_1$ to $790_4$) to reach their new states, Phi2 is lowered, thereby latching the data values. Only after Phi2 has been lowered does control logic unit 1000 raise Phi1.

On receiving the rising edge of Phi1, the values of outputs $734_1$, through $734_4$ again pass through pass transistors $720_1$ through $720_4$. Reference numeral 1116 shows that the change in the output X of the three-bit shift register is synchronized with the rising edge of Phi1. As seen in FIGS. 13G and 13H, the reassertion of Phi1 and the lowering of the User Clock are independent, thus logic designers need not depend on exact timing relationships between these two edges. Of course, Phi1 must be reasserted before the inputs of inverters $726_1$ through $726_4$ float to an invalid voltage.

Figure 14:
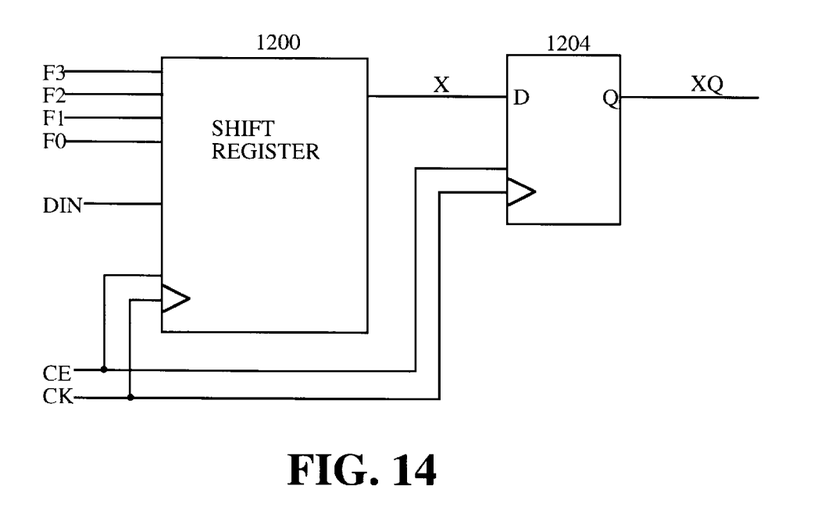
FIG. 14 is a block diagram of a logic element which includes both a shift register and a flip-flop.

FIG. 14 is a block diagram of a logic element which includes both a logic element 1200 and a flip-flop 1204. The purpose of the flip-flop is to improve the clock-to-out delay of the output of the logic element 1200. This is simple and efficient in Xilinx FPGAs because function generators are historically paired with flip-flops in Xilinx logic elements. Further, when an n-bit, synchronous shift register is required, the logic element can be configured so that the shift register 1200 is an (n−1)-bit shift register and flip-flop 1204 is the final register of the n-bit shift register. When configured in this alternative fashion, the final bit XQ is available upon the rising edge 1104 of the User Clock pulse 1108, rather than on the rising edge 1116 of Phi1. This provides a faster clock-to-out time for the overall n-bit shift register.

By configuring the logic element to route XQ back to $D_{in}$, the present invention can also perform circular shifts.

As discussed above (FIGS. 13A–13H), a shift register having fewer stages than the number of memory cells in a lookup table can be formed by directing a bit other than the last bit to output terminal X. Lookup tables likewise may be cascaded to create shift registers of a greater size than supported by a single lookup table. For example, it is possible to create a 20-bit shift register in a logic array composed of 16-bit lookup tables by cascading two logic elements. A first full 16-bit shift register 1200 and a second full 16-bit shift register 1200 combine to produce a 32-bit shift register. Thus, to achieve a 20-bit shift register, user input lines F0–F3 of the first logic element are set to 1111 and user input lines F0–F3 of the second logic element are 0011, i.e., the second 16-bit shift register 1200 is programmed to pass the output of the fourth memory cell $790_4$, which is the final output of the 20-bit shift register. Additionally, in order to improve the clock-to-out delay of the cascaded shift registers, an alternate embodiment uses a first full 16-bit shift register 1200 addressed to 1111, a second full 16-bit shift register 1200 addressed to 0010 and the flip-flop 1204. The output, X, of the second shift register feeds the input of flip-flop 1204 of the second shift register. If desired, the flip-flops 1204 can also be used to extend the number bits that can be shifted within a logic element. Fully utilizing both 16-bit shift registers 1200 and their flip-flops 1204, cascaded shift registers can be built which are 17-bit, 34-bit, 51-bit, etc.

Figure 15:
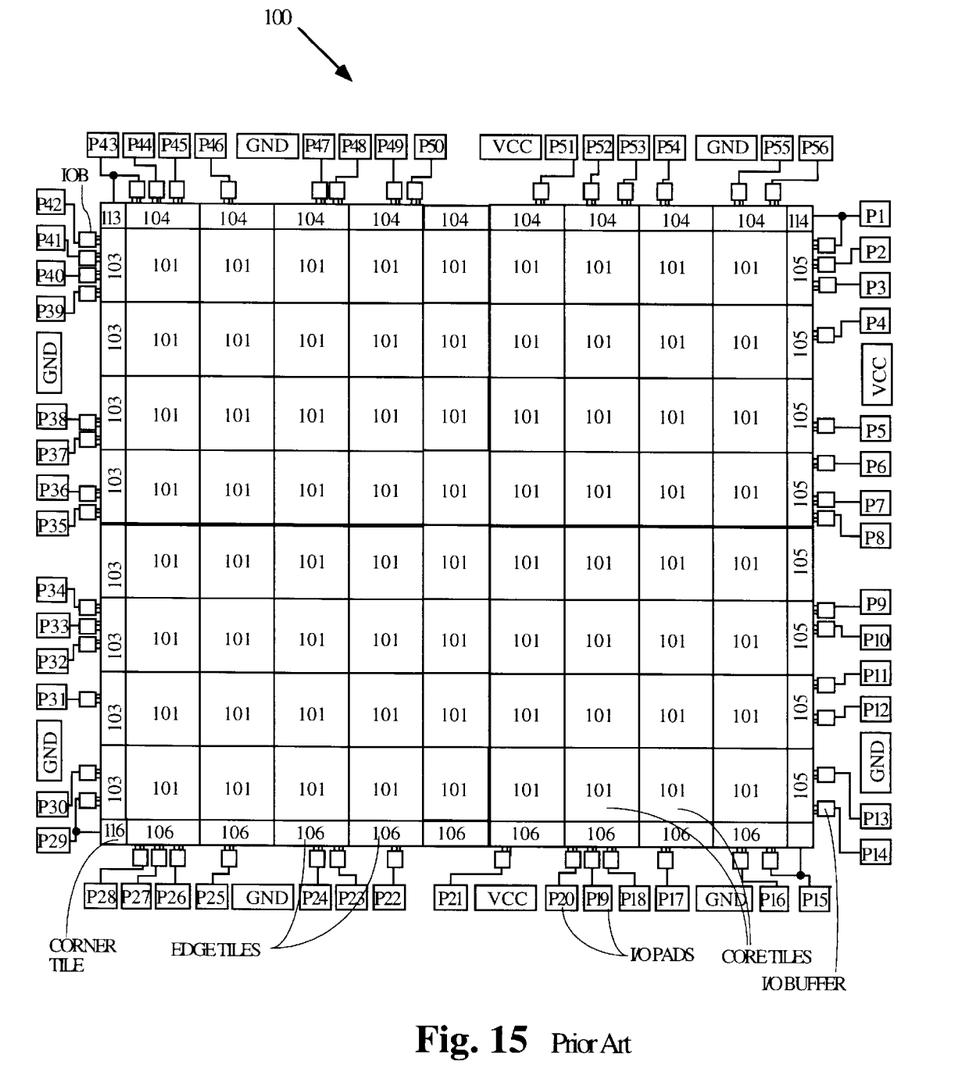
FIG. 15 is a block diagram of an FPGA.

The novel shift register logic element is typically implemented in an FPGA such as the FPGA of FIG. 15 having logic blocks 101, each comprising a portion of an interconnect structure and a logic element. The FPGA of FIG. 15 is further discussed by Tavana et al. in the application Ser. No. 08/618,445 incorporated herein by reference.

Although FIGS. 7 and 10 show a memory cell controlled from only one node of the latch, the invention can also be used with memory cells in which some control signals are inverted and applied to both nodes of the latch, or in which different control signals are applied to different nodes of the latch. Further, in FIG. 10 the three transistors 706, 708, and 707 can be implemented as a multiplexer receiving input signals on lines 704, 714, and 705. And transistors 706, 708, 707, and 720 can be replaced by transmission gates. While particular multiplexer and demultiplexer implementations are shown, the invention can use other implementations as well. And, of course, different structures and methods for generating signals such as Phi1, Phi2, and WS can be used with the invention. Further, although the above embodiments show a single multiplexer with a single output terminal for selecting one signal from a plurality of memory cells, other embodiments can select more than one memory cell from which to provide an output signal.

Numerous modifications and variations of the present invention are possible in light of the above teachings. It is therefore to be understood that within the scope of the appended claims, the invention may be practiced otherwise than as specifically described above.

What is new and desired to be secured by Letters Patent of the United States is:

1. An FPGA comprising:
    a programmable interconnect structure;
    a plurality of configurable logic elements interconnected by said interconnect structure, at least one of said configurable logic elements being configurable as both a shift register and a lookup table.

2. An FPGA as in claim 1 wherein said at least one of said configurable logic elements comprises:
    a plurality of memory cells including at least a first memory cell and a following memory cell, each of the plurality of memory cells having a memory cell input terminal and a memory cell output terminal; and
    shift means for programmably connecting the memory cell output terminal of the first memory cell to the input terminal of the following memory cell.

3. An FPGA as in claim 2 further comprising:
    a configurable logic element data input terminal;
    a configurable logic element data output terminal;
    a multiplexer for connecting a selected one of the memory cell output terminals to the configurable logic element data output terminal; and
    input means for connecting the configurable logic element data input terminal to at least the first memory cell input terminal.

4. In an FPGA having an interconnect structure, a configurable logic element configurable as both a shift register and a lookup table comprising:

a plurality of memory cells including at least a first memory cell and a following memory cell, each of the plurality of memory cells having a memory cell input terminal and a memory cell output terminal;

a configurable logic element data input terminal;

a configurable logic element data output terminal;

shift means for programmably connecting the memory cell output terminal of the first memory cell to the input terminal of the following memory cell;

a multiplexer for connecting a selected one of the memory cell output terminals to the configurable logic element data output terminal as selected by a plurality of input signals received from the interconnect structure; and input means for connecting the configurable logic element data input terminal to at least the first memory cell input terminal.

5. The configurable logic element as claimed in claim 4, further comprising:

a demultiplexer for selectively coupling the configurable logic element data input terminal to a selected one of the plurality of memory cells.

6. In an FPGA, a configurable logic element as claimed in claim 4 further comprising:

control logic for controlling shifting when the configurable logic element is configured as a shift register.

7. The configurable logic element as claimed in claim 6, further comprising:

a configuration memory structure for programming the shift means.

8. The configurable logic element of claim 4, wherein the control logic further comprises:

a user clock terminal for controlling when to shift data between the plurality of memory cells when the configurable logic element is configured as a shift register.

9. The configurable logic element as claimed in a decoding multiplexer for coupling a selected one of the plurality of memory cells to the configurable logic element data output terminal.

10. The configurable logic element as claimed in claim 6, further comprising:

a demultiplexer for selectively coupling the configurable logic element data input terminal to a selected one of the plurality of memory cells.

11. In an FPGA, a configurable logic element comprising:

a plurality of memory cells, each of the plurality of memory cells having a memory cell input terminal and a memory cell output terminal;

a configurable logic element data input terminal;

a configurable logic element data output terminal selectively coupled to the memory cell output terminals of the plurality of memory cells;

an interconnection network selectively coupling the configurable logic element data input terminal to a first memory cell of the plurality of memory cells, and a memory cell output terminal of the first memory cell to a memory cell input terminal of a following memory cell when the configurable logic element is configured as a shift register; and control logic for controlling when the configurable logic element is configured as a shift register, wherein the interconnection network comprises:

a second pass transistor for isolating the configurable logic element data input terminal from the first memory cell;

an inverter selectively coupled to the memory cell output terminal of the first memory cell, the inverter including an inverter input terminal and an inverter output terminal;

a third pass transistor for isolating the memory cell output terminal of the first memory cell from the inverter input terminal; and a fourth pass transistor for isolating the memory cell input terminal of the following memory cell from the inverter output terminal.

12. The configurable logic element as claimed in claim 11, wherein the interconnection network further comprises:

a demultiplexer for selectively coupling the configurable logic element data input terminal to a selected one of the plurality of memory cells; and a first pass transistor for isolating the configurable logic element data input terminal from the demultiplexer.

13. In an FPGA, a configurable logic element comprising:

a plurality of memory cells, each of the plurality of memory cells having a memory cell input terminal and a memory cell output terminal;

a configurable logic element data input terminal;

a configurable logic element data output terminal selectively coupled to the memory cell output terminals of the plurality of memory cells;

an interconnection network selectively coupling the configurable logic element data input terminal to a first memory cell of the plurality of memory cells, and a memory cell output terminal of the first memory cell to a memory cell input terminal of a following memory cell when the configurable logic element is configured as a shift register; and control logic for controlling when the configurable logic element is configured as a shift register, wherein the control logic comprises:

logic for generating two non-overlapping clocking signals to be applied to the interconnection network.

* * * * *